(12) United States Patent
Greer et al.

(10) Patent No.: US 11,658,305 B2
(45) Date of Patent: May 23, 2023

(54) USE AND FABRICATION OF MICROSCAFFOLDS AND NANOSCAFFOLDS

(71) Applicant: California Institute of Technology, Pasadena, CA (US)

(72) Inventors: Julia R. Greer, San Marino, CA (US); Lucas R. Meza, Pasadena, CA (US); Lauren C. Montemayor, Pasadena, CA (US); Xun W. Gu, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 481 days.

(21) Appl. No.: 16/752,372

(22) Filed: Jan. 24, 2020

(65) Prior Publication Data

US 2020/0161662 A1 May 21, 2020

Related U.S. Application Data

(63) Continuation of application No. 14/254,824, filed on Apr. 16, 2014, now Pat. No. 10,553,875, which is a continuation of application No. PCT/US2014/034421, filed on Apr. 16, 2014.

(60) Provisional application No. 61/938,503, filed on Feb. 11, 2014, provisional application No. 61/817,637, filed on Apr. 30, 2013, provisional application No. 61/817,633, filed on Apr. 30, 2013, provisional application No. 61/812,621, filed on Apr. 16, 2013, provisional application No. 61/812,633, filed on Apr. 16, 2013.

(51) Int. Cl.
*G03F 7/00* (2006.01)
*G03F 7/20* (2006.01)
*H01M 4/72* (2006.01)
*H01M 8/0247* (2016.01)
*H01G 11/30* (2013.01)
*H01G 11/26* (2013.01)

(52) U.S. Cl.
CPC ............ *H01M 4/72* (2013.01); *G03F 7/0037* (2013.01); *G03F 7/70375* (2013.01); *H01G 11/26* (2013.01); *H01G 11/30* (2013.01); *H01M 8/0247* (2013.01); *Y02E 60/13* (2013.01)

(58) Field of Classification Search
CPC ... G03F 7/0037; G03F 7/70375; H01G 11/26; H01G 11/30
See application file for complete search history.

(56) References Cited

U.S. PATENT DOCUMENTS

| 7,687,132 B1 | 3/2010 | Gross |
| 2009/0171406 A1 | 7/2009 | Foley et al. |

(Continued)

FOREIGN PATENT DOCUMENTS

WO 2008142129 A2 11/2008

OTHER PUBLICATIONS

Bauer, Jens et al., "High-strength cellular ceramic composites with 3D microarchitecture", PNAS Early Edition, 2013, pp. 1-6.

(Continued)

*Primary Examiner* — Stewart A Fraser
(74) *Attorney, Agent, or Firm* — Gavrilovich, Dodd & Lindsey LLP

(57) ABSTRACT

A scaffold includes struts that intersect at nodes. In some instances, a cross section of the cores has at least one dimension less than 100 microns. The core can be a solid, liquid or a gas. In some instances, one or more shell layers are positioned on the core.

11 Claims, 11 Drawing Sheets

(56) References Cited

U.S. PATENT DOCUMENTS

| | | | | |
|---|---|---|---|---|
| 2010/0316898 | A1 | 12/2010 | Howard et al. | |
| 2012/0215310 | A1 | 8/2012 | Sharp et al. | |
| 2012/0271418 | A1* | 10/2012 | Hollister | A61F 2/28 623/23.57 |
| 2013/0203146 | A1* | 8/2013 | Ying | A61L 27/54 435/177 |
| 2013/0244179 | A1* | 9/2013 | Bowman | C08G 61/12 264/447 |
| 2014/0263217 | A1* | 9/2014 | Pacetti | A61F 2/91 219/121.72 |

OTHER PUBLICATIONS

Becamel, Philippe, International Preliminary Report on Patentability and Written Opinion, PCT/US2014/034421, dated Oct. 29, 2015.

Copenheaver, Blaine R, International Search Report and Written Opinion, PCT/US2014/034421, dated Nov. 20, 2014.

Fleck et al., "Micro-architectured materials: past, present and future," Proc. R. Soc. A, vol. 466, pp. 2495-2516, Jun. 30, 2010.

Jacobsen et al., "Three-Dimensional Open-Cellular Materials Formed From Self-Propagating Polymer Waveguides," European Soc. For Composite Mater., 2012.

Jacobsen et al., "Interconnected Self-Propagating Photopolymer Waveguides: An Alternative to Stereolithography for Rapid Formation of Lattice-Based Open-Cellular Materials," 21st Annual International Solid Freeform Fabrication Symposium—An Additive Manufacturing Conference, 2010.

Jang, Dongchan et al., "Fabrication and deformation of three-dimensional hollow ceramic nanostructures", Nature Materials, Oct. 2013, vol. 12, pp. 893-898.

Lifson et al., "Enabling Simultaneous Extreme Ultra Low-k in Stiff, Resilient, and Thermally Stable Nano-Architected Materials," Nano Lett., vol. 17, pp. 7737-7743, 2017.

Liontas and Greer, "3D nano-architectured metallic glass: Size effect suppresses catastrophic failure," Acta Materials, vol. 133, pp. 393-407, 2017.

Liu et al., "Co3O4 nanowire@MnO2 ultrathin nansheet core/shell arrays: A new class of high-performace pseudocapacitive materials," Adv. Mater., vol. 23, No. 18, pp. 2076-2081, 2011.

Montemayor, Lauren C. et al., "Design and Fabrication of Hollow Rigid Nanolattices via Two-Photon Lithography", Advanced Engineering Materials, 2013, pp. 1-6.

Montemayor et al., "Materials by design: Using architecture in material design to reach new property spaces," MRS Bulletin, vol. 40, pp. 1122-1129, Dec. 2015.

Schaedler et al., "Ultralight Metallic Microlattices," Science, vol. 334, No. 6058, pp. 962-965, Nov. 17, 2011.

Valdevit et al., "Compressive strength of hollow microlattices: Experimental Characterization, Modeling, and Optimal Design," J. Mater. Res , vol. 28, No. 17, pp. 2461-2473, Sep. 14, 2013.

Yamashita et al., "Waveguide Shape Control and Loss Properties of Light-Induced Self-Written (LISW) Optical Waveguides," J. of Lightwave Tech., vol. 20, No. 8, pp. 1556-1562, Aug. 2002.

Zheng, Xiaoyu et al., "Ultralight, ultrastiff mechanical metamaterials", Science, 344, 1373, 2014.

\* cited by examiner

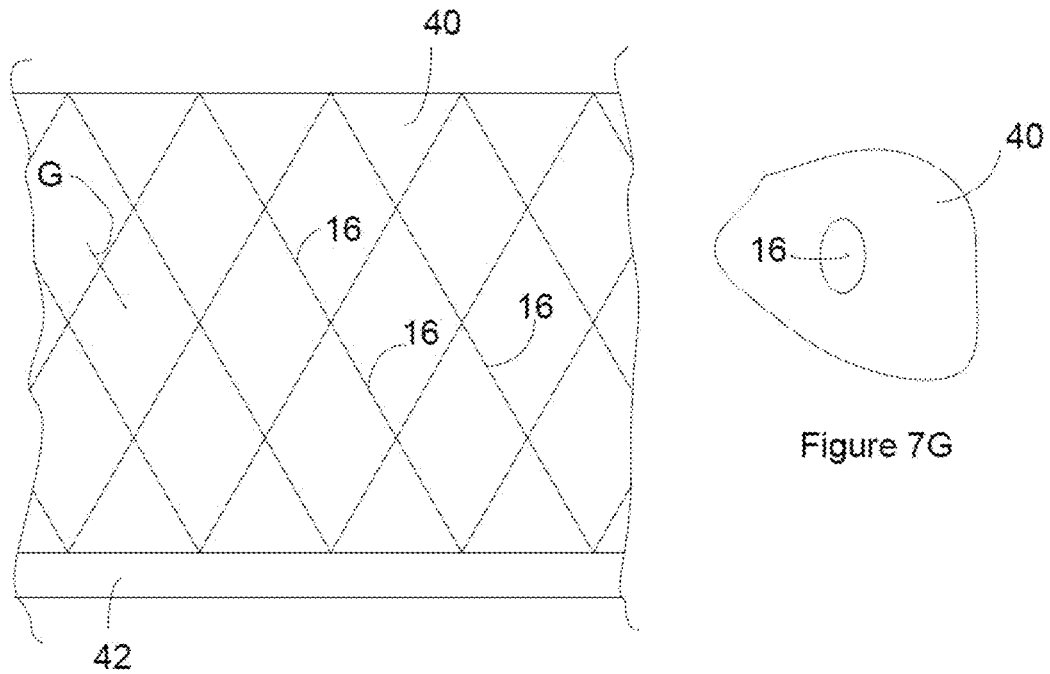
Figure 7F
Figure 7G
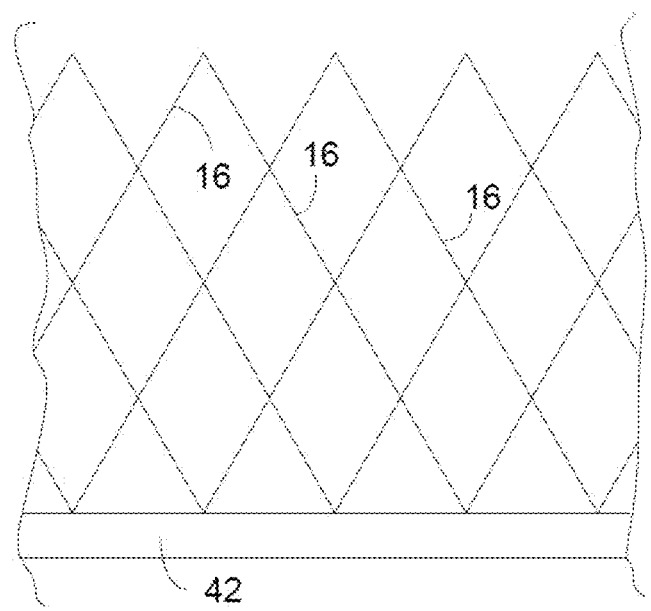
Figure 7H

USE AND FABRICATION OF MICROSCAFFOLDS AND NANOSCAFFOLDS

RELATED APPLICATIONS

This application is a continuation of U.S. application Ser. No. 14/254,824, filed Apr. 16, 2014, which application claims the benefit of U.S. Provisional Patent Application 61/817,633, filed on Apr. 30, 2013; and also claims the benefit of U.S. Provisional Patent Application 61/817,637, filed on Apr. 30, 2013; and also claims the benefit of U.S. Provisional Patent Application 61/812,621, filed on Apr. 16, 2013; and also claims the benefit of U.S. Provisional Patent Application 61/812,633, filed on Apr. 16, 2013; and also claims the benefit of U.S. Provisional Patent Application 61/938,503, filed on Feb. 11, 2014; and is a continuation of PCT Patent Application number PCT/US2014/034421, filed on Apr. 16, 2014, each of which is incorporated herein in its entirety for any and all purposes.

STATEMENT REGARDING FEDERALLY SPONSORED RESEARCH

This invention was made with government support under Grant No. DGE1144469 and under Grant No. DMR1204864 awarded by the National Science Foundation. The government has certain rights in the invention.

FIELD

The present invention relates to scaffolds and more particularly to microscaffolds and nanoscaffolds.

BACKGROUND

Biological materials such as wood, bone, and crustaceous shells have desirable mechanical properties such as high damage tolerance and low density. Attempts have been made to mimic the structure of these biological materials in order to capture these mechanical properties. However, these biological materials have gained these advantages by combining material selection with structural arrangements having nanoscale features. The ability to fabricate structures with the desired dimensions and materials has been limited by the available nanofabrication technologies. As a result, there is a need for fabrication technologies that permit use of these materials on structures having nanoscale features.

SUMMARY

A scaffold includes struts that intersect at nodes. Each of the struts has a core. A cross section of the cores has at least one dimension less than 10 microns where the cross section is taken perpendicular to a longitudinal axis of the core. The core can be a solid, liquid or a gas. In some instances, one or more shell layers are positioned on the core.

Another embodiment of the scaffold includes struts intersecting at nodes. The struts that terminate at two nodes each has a length equal to the distance between the two nodes at which the strut terminates. At least a portion of the struts that terminate at two nodes each has a length less than 100 microns.

Another embodiment of the scaffold includes struts intersecting at nodes. At least a portion of the struts intersect so as to define periodically spaced unit cells in the scaffold. The unit cells are repeated with a period length less than 200 microns, or less than 100 microns.

A method of fabricating a scaffold includes employing multiphoton absorption to define frame members in a frame precursor. The method also includes using the frame members to form struts that intersect at nodes.

In some instances, the scaffold serves as an electrode or is included in an electrode. In some instances, the scaffold serves as an electrode or is included in an electrode of a functioning device. Examples of functioning devices include, but are not limited to, batteries, fuel cells, capacitors, and supercapacitors.

BRIEF DESCRIPTION OF THE FIGURES

FIG. 1A is a sideview of a portion of the scaffold.

FIG. 1B is a cross section of the scaffold.

FIG. 2A is a perspective view of the strut.

FIG. 2B is a cross section of a strut constructed according to FIG. 2A.

FIG. 2C is a cross section of a node where four struts constructed according to FIG. 2A intersect one another.

FIG. 6A is a cross section of a device precursor having a frame precursor on a substrate.

FIG. 6B is a cross section of the device precursor after a frame is formed in the frame precursor of FIG. 6A.

FIG. 6C is a cross section of a frame member shown in FIG. 6B taken along the line labeled C in FIG. 6B.

FIG. 6D is a cross section of the device precursor after the remaining frame precursor is removed from the device precursor of FIG. 6B and FIG. 6C.

FIG. 6E is a cross section of the device precursor after a shell is formed on frame members in the device precursor of FIG. 6D.

FIG. 6F is a cross section of a frame member shown in FIG. 6E taken along the line labeled F in FIG. 6E.

FIG. 6G is a cross section of the device precursor after the frame members are removed from the device precursor of FIG. 6E and FIG. 6F.

FIG. 6H is a cross section of a frame member shown in FIG. 6G taken along the line labeled H in FIG. 6G.

FIG. 7A through FIG. 7J illustrate another embodiment of method for generating a scaffold having octahedral unit cells. FIG. 7A is a cross section of a device precursor having a frame precursor on a substrate.

FIG. 7B is a cross section of the device precursor after frame members are formed in the frame precursor of FIG. 7A.

FIG. 7C is a cross section of a frame member shown in FIG. 7B taken along the line labeled C in FIG. 7B.

FIG. 7D is a cross section of the device precursor after the frame are removed from the device precursor of FIG. 7B and FIG. 7C so as to form frame voids in the frame precursor.

FIG. 7E is a cross section of a frame void shown in FIG. 7D taken along the line labeled E in FIG. 7D.

FIG. 7F is a cross section of the device precursor after the frame voids in the device precursor of FIG. 7D and FIG. 7E are filled.

FIG. 7G is a cross section of a frame void shown in FIG. 7F taken along the line labeled G in FIG. 7F.

FIG. 7H is a cross section of the device precursor after the remaining frame precursor is removed from the device precursor of FIG. 7F and FIG. 7G.

FIG. 7I is a cross section of the device precursor.

FIG. 7J is a cross section of a frame member 44 shown in FIG. 7I taken along the line labeled I in FIG. 7I.

FIG. 8A is a sideview of the node.

FIG. 8B is a topview of the node.

FIG. 8C is the sideview illustrated in FIG. 8A after a force has been applied to the node in the direction of the arrow labeled F in FIG. 8A.

DETAILED DESCRIPTION

Figure 1A:
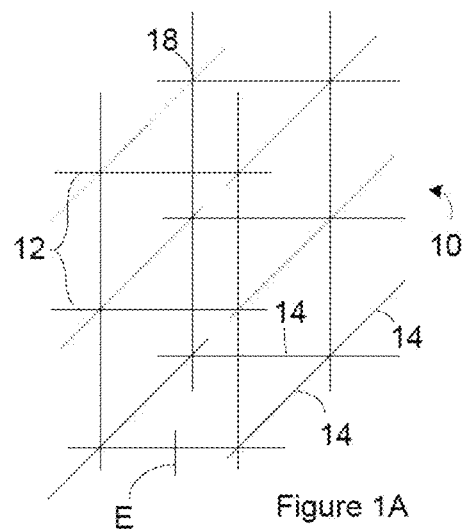
FIG. 1A and FIG. 1B illustrates a portion of a scaffold. A very simplified scaffold construction using a cubic unit cell is shown in order to simplify the drawings. The scaffold includes struts that intersect at nodes.

As used herein and in the appended claims, the singular forms "a," "an," and "the" include plural referents unless the context clearly dictates otherwise. Thus, for example, reference to "a scaffold" includes a plurality of such scaffolds and reference to "the core" includes reference to one or more cores, and so forth.

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Any publications discussed above and throughout the text are provided solely for their disclosure prior to the filing date of the present application. Nothing herein is to be construed as an admission that the inventors are not entitled to antedate such disclosure by virtue of prior disclosure.

Scaffolds have struts that intersect one another at nodes. Scaffold fabrication methods can make use of multiphoton absorption to form these scaffolds at high resolution levels. As a result, the scaffolds can be formed with surprisingly small features. For instance, the disclosed fabrication methods permit formation of scaffolds with microscale and nanoscale features that could not be achieved with the prior fabrication methods that are generally limited to features above 50 microns. Further, multiphoton absorption allows scaffold features to be formed in the center of the photoresist without the feature extending to the perimeter of the photoresist. Almost any scaffold configuration is possible. For instance, the struts can be straight or curved and/or different struts can have different dimensions. Further, complex scaffold configurations such as kagome lattices and auxectic structures are possible. Further, the small dimensions that can be achieved permit complex strut intersections. For instance, two or more intersecting struts can be offset relative to one another. Finally, the scaffold fabrication techniques permit a broad range of materials to be included in the scaffolds in a broad range of configurations. As a result, the scaffolds can provide a low weight and highly damage resistant materials. Further, these scaffolds provide an effective platform for studying biological structures such as wood, bone, and crustaceous shells.

The use of these scaffolds is not limited to low weight materials that are resistant to physical damage. For instance, one suitable application of these scaffolds is electrodes in applications such as electrochemistry, electrophoresis, capacitors, photovoltaics, micro- and nano-electrochemical systems (MEMS and NEMS), optoelectronic devices, catalysis, and lab-on-a-chip. For instance, the ability to use a broad range of materials with these scaffolds allows the struts of the scaffold to include or consist of the active material for a battery electrode. A challenge with high capacity active materials for batteries is the extensive volume changes during that these active materials experience during charging and/or discharging of the battery. The expansion and contraction of the active material can serve as a source of electrode damage and/or battery failure. When a battery electrode is constructed such that struts of the scaffold include or consist of these active materials, the struts can swell into the spaces between the struts during expansion of the active materials. Additionally, the structure of the scaffold can spread the volume expansion throughout the electrode. As a result, the tolerance of the electrode for the expansion of the active materials is enhanced. The enhanced tolerance to expansion can make it possible for the batteries to use materials that were not previously practical. For instance, silicon is desirable for use as an active material in secondary lithium ion batteries due to its high capacity; however, silicon can swell as much as 400% during intercalation of lithium ions into the silicon. This degree of swelling has made the use of silicon impractical. However, the ability of the disclosed scaffolds to accommodate this degree of swelling can permit the use of silicon in batteries.

Figure 1B:
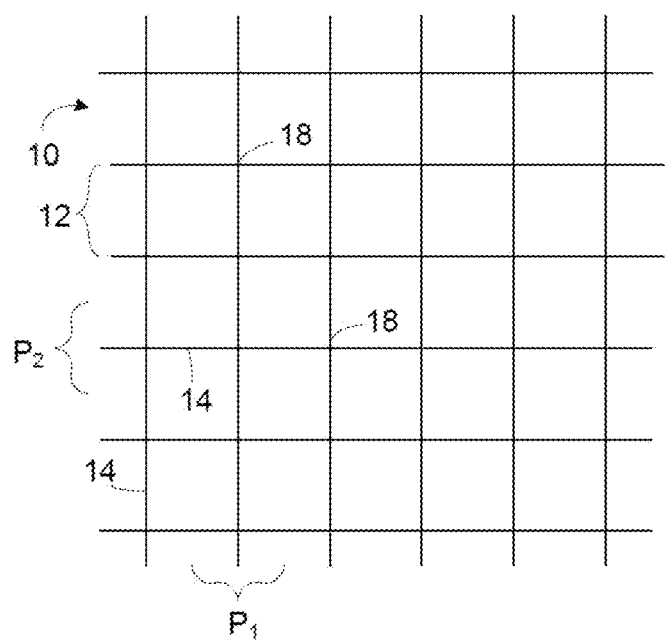

FIG. 1A and FIG. 1B illustrates a portion of a microstructure that includes a scaffold 10. FIG. 1A is a perspective view of a portion of the scaffold 10. FIG. 1B is a sideview of the scaffold 10. A very simplified scaffold construction using cubic cells is shown in order to simplify the drawings. More complex scaffold structures are disclosed below.

Figure 1C:
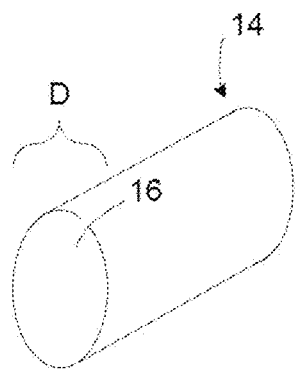
FIG. 1C is a perspective view of a portion of a strut.
Figure 1D:
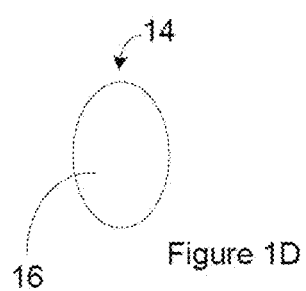
FIG. 1D is a cross section of a strut.
Figure 1E:
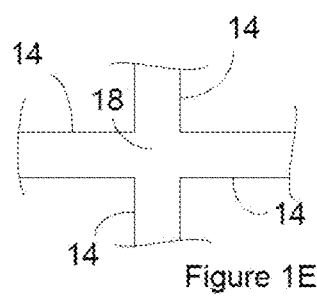
FIG. 1E is a cross section of a node where four struts intersect one another.

The scaffold includes or consists of struts 14. FIG. 1C is a perspective view of a portion of a strut 14 and FIG. 1D is a cross section of a strut 14. The cross section of FIG. 1D is taken perpendicular to the longitudinal axis of the strut 14 and can represent the cross section of the scaffold shown in FIG. 1A taken along the line labeled E. The strut 14 includes a solid core 16. The struts 14 intersect one another at nodes 16. FIG. 1E is a cross section of a node 16 where four struts 14 intersect one another. The materials of the different struts 14 are continuous with one another. Other node 16 constructions are possible. For instance, there can be interfaces between different struts 14 and/or between different materials from different struts 14. Suitable materials for the core 16 include, but are not limited to, metals, alloys, and polymers.

Figure 2A:
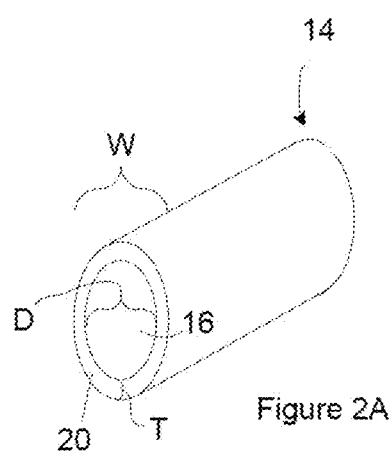
FIG. 2A through FIG. 2C illustrate another embodiment of a strut.
Figure 2C:
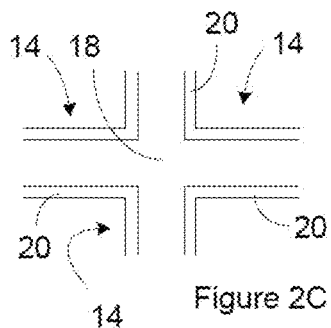
Figure 2B:
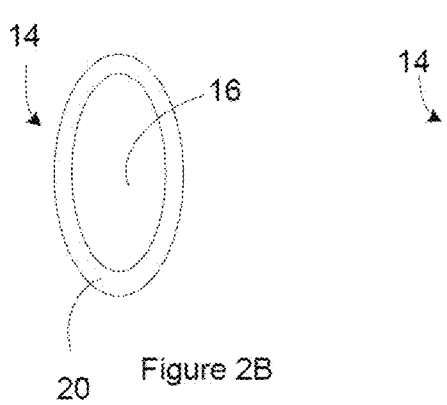

FIG. 2A through FIG. 2C illustrate another possible construction for the struts 14. FIG. 2A is a perspective view of a portion of a strut 14 and FIG. 2B is a cross section of a strut 14. The cross section of FIG. 2B could represent the cross section of the scaffold shown in FIG. 1A taken along the line labeled E. The struts 14 include a shell 20 on the core 16. The core 16 can be a solid, a liquid, or a gas. In some instances, the core 16 is filled with the ambient atmosphere in which the scaffold is positioned. Since the core 16 can be a liquid or a gas, the core 16 can be defined by an interior of the shell 20. For instance, an interior surface of the shell 20 can define a lumen that extends longitudinally through the strut 14. FIG. 2C is a cross section of a node 18 where four struts 14 intersect one another. The materials of the different struts 14 are continuous with one another through the node 18. For instance, the cores 16 of the struts 14 are continuous with one another and/or the shells 20 of the struts 14 are continuous with one another. Other node 18 constructions are possible. For instance, there can be an interface or interfaces between the materials of different cores 16 at the node 18 and/or between different the materials from different shells 20.

Figure 2D:
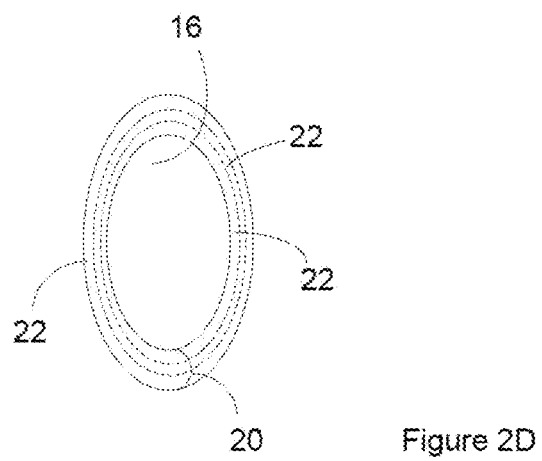
FIG. 2D is a cross section of a strut having a shell that includes multiple different shell layers.

Although FIG. 2A through FIG. 2C illustrate the shell 20 as being constructed of a single layer of material, the shell 20 can be constructed of more than one shell layer 22 as illustrated in FIG. 2D. Each shell layer 22 includes or consists of one or more shell materials. Different shell layers 22 can have the same materials or different materials. Materials for a shell layer include materials that can be formed on a solid core using deposition techniques. Examples of deposition techniques include vapor deposition techniques such as chemical vapor deposition (CVD) and its variants such as atomic layer deposition (ALD). Examples of suitable materials for use as a shell layer include, but are not limited to, metals, alloys, and ceramics such as alumina. Although FIG. 2A through FIG. 2C illustrate the shell 20 surrounding the core 16, the core 16 can include other arrangements of materials positioned on the surface of the core 16. For instance, the core 16 can include materials coated on the surface of the core 16 such that islands or aggregates of the materials are located on different regions of the core 16 surface.

A first dimension of the core 16 is labeled D in FIG. 1C and FIG. 2A. The illustrated cores 16 have elliptical cross sections. Accordingly, the illustrated cores have a minor axis and a major axis. The first dimension represents the smallest dimension of the cross section that must be defined by the scaffold fabrication technique. Accordingly, the first dimension represents the length of the minor axis. The cross section of the core 16 can have other geometries including, but not limited to, round, square, rectangle, oval, and a plus sign. As a result, the first dimension can represent the width, diameter, length and/or width of a branch on a plus sign. The first dimension can be less than 50 microns, 10 microns, 1 micron, 500 nm, or 150 nm. The struts also have a length. When a strut terminates at two nodes, the length of the strut is the distance that the strut extends between nodes. The disclosed method of fabricating the scaffold also permits the struts to be fabricated with lengths having these dimensions. As a result, in some instances, at least a portion of the struts in a scaffold have a length less than less than 1000 microns, 50 microns, 10 microns, 1 microns, 500 nm, or even 150 nm. Accordingly, at least a portion of the struts in a scaffold can have at least one dimension that is less than 50 microns, 10 microns, 1 micron, 500 nm, or even 150 nm.

In FIG. 2A, a second dimension of the strut 14 is labeled T and a third dimension is labeled W. The second dimension describes a thickness of a shell layer 22 in that it describes a distance between an outer surface of the shell layer 22 and the inner surface of the shell layer 22. In some instances, at least a portion of the struts have a second dimension less than 1 micron, 200 nm, 100 nm, or 50 nm and/or greater or equal to 1 angstrom. The third dimension is an external dimension in that it describes a distance between two locations on an outside of the strut 14. For instance, the third dimension can describe a distance between two different locations on the outer surface of the shell 20. The illustrated strut 14 has a round cross section. Accordingly, the third dimension represents the diameter of the strut 14. However, the cross section of the strut 14 can have other geometries including, but not limited to, a square rectangle, oval, ellipse, and a plus sign. As a result, the third dimension can represent the width, diameter, length of a major axis, length of a minor axis, length and/or width of a branch on a plus sign. Even when the struts 14 have a shell 20, the small dimensions of the core 16 allow the third dimension to be reduced relative to prior scaffolds. In some instances, at least a portion of the struts have a third dimension less than 50 microns, 10 microns, 1 microns, 500 nm, or even 150 nm.

In one example, the struts have a structural ratio (second dimension/third dimension) that is less than or equal to 0.02. In a particular example, the struts have an elliptical cross section and a ratio of the shell thickness to the major axis length is less than or equal to 0.02. In another example, the struts have an elliptical cross section, are hollow with a ceramic shell, and a ratio of the shell thickness to the major axis length is less than or equal to 0.02. In another example, the struts have an elliptical cross section, are hollow with an alumina shell, and a ratio of the shell thickness to the major axis length is less than or equal to 0.02. In some instances, the scaffold has a density less than 10 mg/cm$^3$.

The disclosed methods for fabricating the scaffolds permit one or more variables selected from the group consisting of the first dimension, the second dimension, and the third dimension to be varied over a wide range. As a result, the porosity of the scaffold can be tightly controlled and surprisingly low porosity levels can be achieved. In some instances, one or more of these variables is varied so as to achieve a porosity less than 25%, or 10%.

Figure 3:
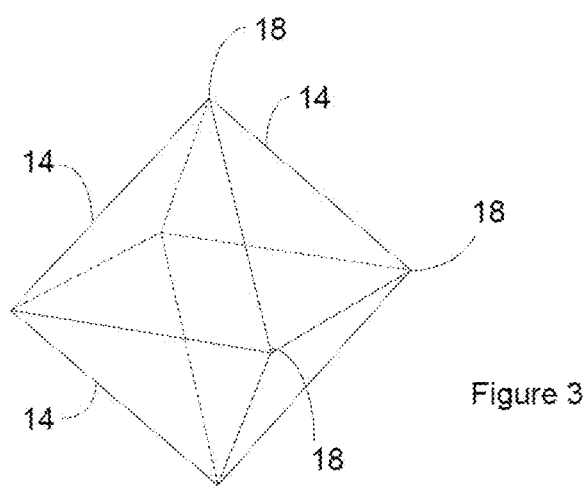
FIG. 3 is a sideview of an octahedral unit cell.

The disclosed fabrication method permits the use of more complex scaffolds and/or unit cells. For instance, the struts 14 can be arranged in octets or octahedrons as illustrated in FIG. 3. The unit cell is the smallest unit that can be repeated so as to create the portion of a scaffold that is periodic. As a result, when the octahedron includes two four sided pyramids of the same dimensions, the four sided pyramid serves as the unit cell. Accordingly, the scaffold can include or consist of repeated four sided pyramids or repeated octahedrons.

Figure 4A:
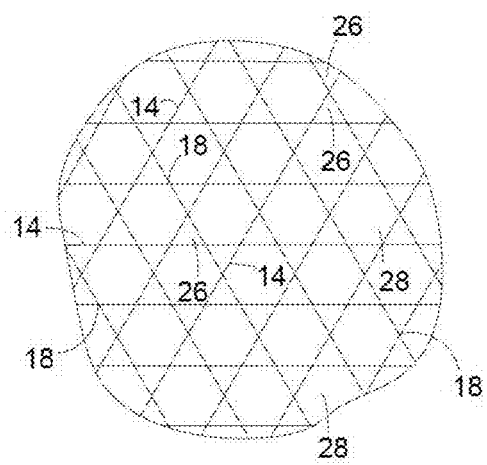
FIG. 4A illustrates a two-dimensional kagome lattice.

Another suitable scaffold of interest includes the struts 14 arranged such that the scaffold includes or consists of a kagome lattice. FIG. 4A illustrates struts arranged in a two-dimensional kagome lattice. Although the illustrated lattice is called "two-dimensional," the lattice need not be planar. For instance, the nodes and/or struts need not be co-planar. Each node 18 of the two-dimensional kagome lattice includes two triangles alternating 26 with two hexagons 28.

Figure 4B:
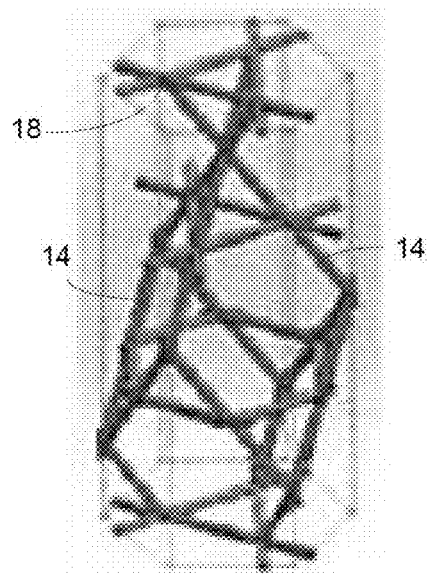
FIG. 4B is a perspective view of a unit cell for a three-dimensional kagome lattice.
Figure 4C:
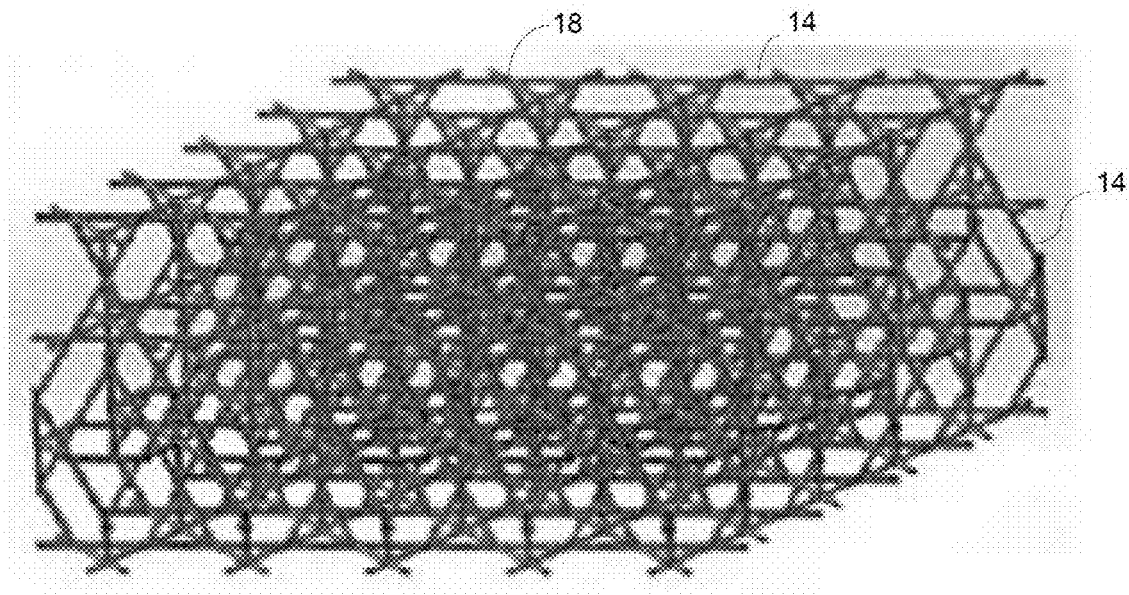
FIG. 4C is a perspective view of a portion of a three-dimensional kagome lattice.

FIG. 4B is a perspective view of a unit cell suitable for constructing a three-dimensional kagome lattice. FIG. 4C illustrates a portion of a scaffold having the struts are arranged in a three-dimensional kagome lattice using the unit cells of FIG. 4B. The surprising ability to form kagome lattices in scaffolds having these dimensions can increase the fracture resistance of the scaffold due to crack tip blunting. The scaffold can include kagome lattices without being arranged as illustrated in FIG. 4B and FIG. 4C. For instance, the scaffold can include struts that extend between two-dimensional kagome lattices constructed as shown in FIG. 4A. Accordingly, the scaffold can include a three-dimensional kagome lattice or can include multiple two-dimensional kagome lattices. As a result, in some instances, the nodes of the scaffold includes at least two triangles alternating 26 with at least two hexagons 28.

Figure 5A:
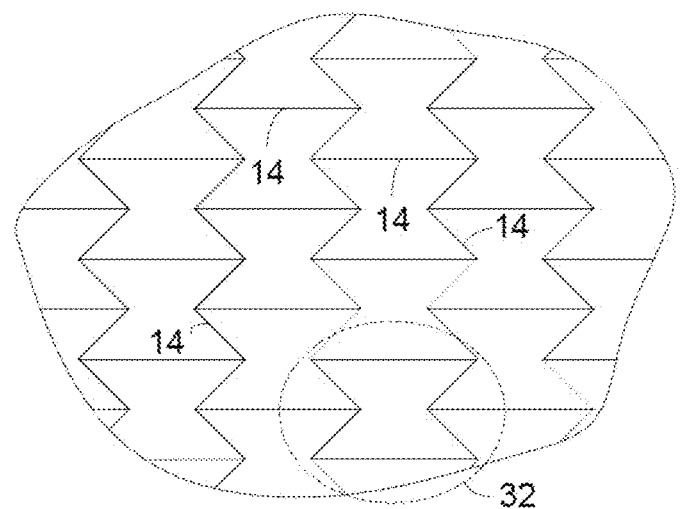
FIG. 5A illustrates struts arranged in a lattice of auxectic structures.
Figure 5B:
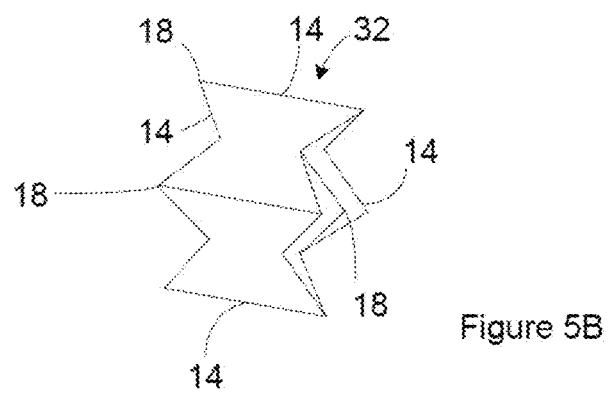
FIG. 5B illustrates a unit cell for a scaffold that includes intermediate struts extending between auxectic structures arranged as shown in FIG. 5A.

The scaffold can also be configured such that the unit cells have a negative Poisson's ratio. For example, the unit cells can be constructed such that when compressed by an applied force, the unit cells become thinner perpendicular to the applied force. In one example, the unit cells are constructed so as to include one or more auxectic structures 32. For instance, FIG. 5A illustrates struts 14 arranged in a lattice of auxectic structures. A scaffold can have intermediate struts 14 extending between adjacent lattices that each includes the auxectic structures. For instance, FIG. 5B illustrates a unit cell for a scaffold that includes intermediate struts 14 extending between auxectic structures arranged as shown in FIG. 5A. Only the struts 14 positioned at the front of the unit cell are shown in order to reduce the complexity of the drawing. The intermediate struts 14 are also arranged so as to form auxectic structures although other arrangements for the intermediate struts 14 are possible. The auxectic structures of FIG. 5A and FIG. 5B are exemplary and a scaffold can include other auxectic structures.

The scaffold need not be periodic; however, as is evident from FIG. 1A through FIG. 5B, the disclosed fabrication techniques can optionally be used to create scaffolds where all or a portion of the scaffold is periodic. For instance, the struts can optionally be arranged so as to define multiple unit cells that are repeated periodically to form all or a portion of the scaffold. Accordingly, all or a portion of the scaffold can optionally be periodic. For instance, the portion of the scaffold illustrated in FIG. 1A includes multiple cubic unit cells that are repeated so as to create the illustrated portion of the scaffold 10. Lateral repetition of the unit cells defines a cell layer 12 in the scaffold. Multiple cells layers are stacked to add height to the scaffold. In this configuration, the scaffold includes a first period labeled $P_1$ in FIG. 1B and a second period labeled $P_2$ in FIG. 1B. The first period is the distance between the centers of the unit cells unit cells in the same layer and the second period is the shortest distance between the center of a unit cell in one layer and the center of a unit cell in another layer. A suitable length for the first period and/or the second period include lengths less than 200 microns, 50 microns, 10 microns, 1 micron, or even 500 nm and/or greater than 50 nm. The cell layers 12 can be repeated so as to provide more than 2 or 3 cells layers.

Figure 6A:
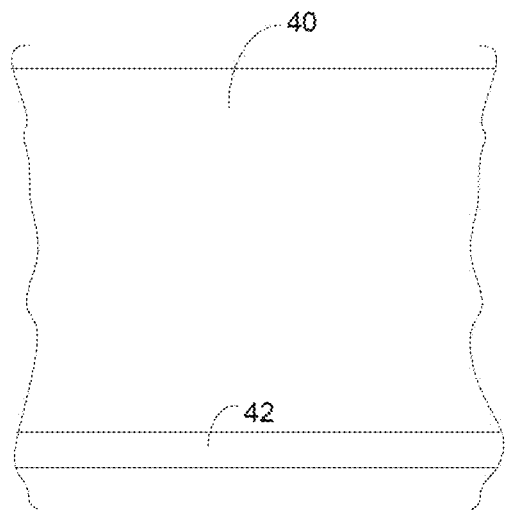
FIG. 6A through FIG. 6H illustrate a method of generating a scaffold from a device precursor.

FIG. 6A through FIG. 6H illustrate a method of generating a scaffold having octahedral unit cells. A frame precursor 40 is formed on a substrate 42 so as to provide a device precursor having a cross section as shown in FIG. 6A. FIG. 6A is a cross section of the device precursor. The frame precursor 40 can be a negative photoresist. In some instances, the photoresist includes or consists of a photopolymer. Photopolymers change their chemical properties when exposed to light or to light of certain wavelengths. In some instances, the photopolymer changes its solubility in a lithography developer in response to exposure of the photopolymer to light of a particular wavelength or range of wavelengths. For instance, a suitable photopolymer can polymerize and/or cross link in response to exposure of the photopolymer to the light. An example of a suitable photopolymer includes, but is not limited to, IP-DIP 780 photoresist available from Nanoscribe, Inc. Suitable materials for the substrates 42, include, but are not limited to, metals such as aluminum.

Figure 6B:
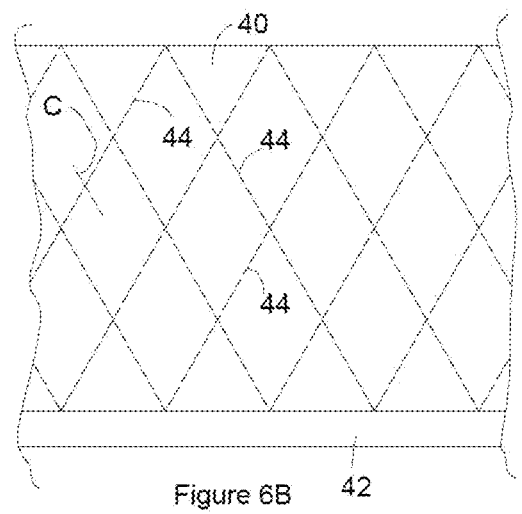
Figure 6C:
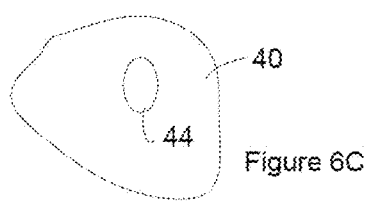

A frame is formed in the frame precursor 40 of FIG. 6A so as to form the device precursor of FIG. 6B and FIG. 6C. FIG. 6B is a cross section of the device precursor. The frame includes multiple frame members 44 that intersect at nodes. FIG. 6C is a cross section of a frame member 44 shown in FIG. 6B taken along the line labeled C in FIG. 6B. As will become evident below, the frame members 44 become the core of the struts or are replaced by one or more materials that serve as the cores for the struts in the final scaffold. Accordingly, the arrangement of the frame members 44 is the same as or approximates the desired arrangement for the cores of the struts in the resulting scaffold. As a result, in some instances, the frame members 44 have the same dimensions as are set forth for the cores of the struts.

A suitable method for forming the frame in the frame precursor 40 includes, but is not limited to, multiphoton photolithography such as two-photon lithography. Other names for multiphoton photolithography include direct laser writing and direct laser lithography. In multiphoton photolithography, the frame precursor 40 is transparent or substantially transparent to the wavelength of a light source so as to suppress single photon absorption relative to multiphoton absorption. The multiphoton absorption can cause the desired chemical change of the frame precursor 40. For instance, when the frame precursor 40 includes or consists of a photopolymer, the multiphoton absorption can cause polymerization of the photopolymer and/or cross-linking of the photopolymer. When the photopolymer is IP-DIP 780 photoresist, the multiphoton absorption can cross-link the polymer.

In some instances, the light source used for multiphoton absorption is configured to have a focal point. In some instances, the light intensity requirements needed for multiphoton absorption cause the desired chemical change to occur at the focal point or focal volume of the light source without substantially occurring outside of the focal volume. By controlling the location of the focal point or focal volume of the light source within the frame precursor 40, the location of the chemical change within the frame precursor 40 can be controlled. For instance, the relative positions of the device precursor and light source can be changed such that the focal point or focal volume of the light source effectively scans the desired locations of the frame members 44 within the frame precursor 40. Since the desired chemical change is localized relative to the focal point or focal volume of the light source, the use of multiphoton absorption permits the scaffold features to be formed with the above dimensions. Further, since the desired chemical change is localized to the focal point, the chemical change does not substantially occur between the light source and the focal point. Accordingly, a trace of the chemical change does not occur between the target location of the frame member 44 and the light source. As a result, features can be formed centrally within the frame precursor 40 without the feature extending to the perimeter of the frame precursor 40. The ability to form features centrally within the frame precursor 40 permits the formation of frame members 44 and the resulting struts in nearly any configuration.

Figure 6D:
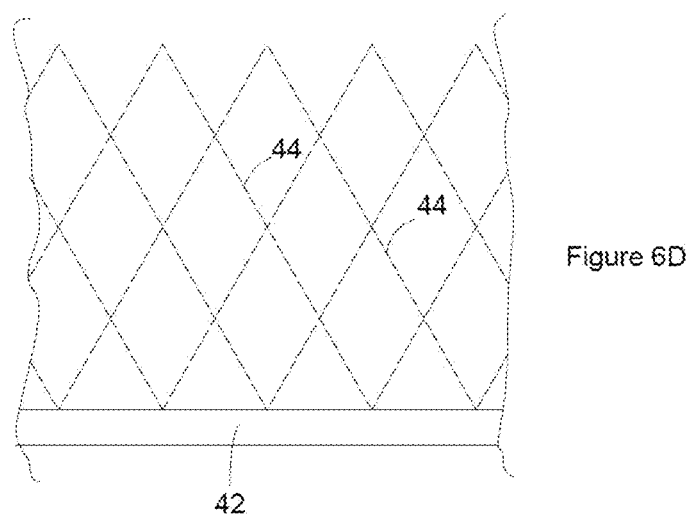

The remaining frame precursor 40 can be removed from the device precursor of FIG. 6B and FIG. 6C so as to form the device precursor of FIG. 6D. For instance, when the frame precursor 40 acts as a negative photoresist, the frame precursor 40 can removed with a developer. In instances where a shell 20 is not desired on the core of the struts and the frame members 44 are constructed of the material that is desired for the cores of the struts, the frame on the device precursor of FIG. 6D can serve as the scaffold.

Figure 6E:
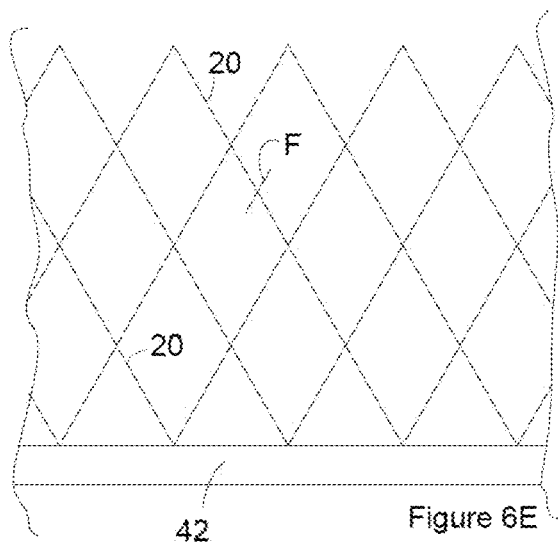
Figure 6F:

When it is desirable for the core to include a shell 20, the shell 20 can be formed on frame members 44 in the device precursor of FIG. 6D so as to form the device precursor of FIG. 6E and FIG. 6F. FIG. 6E is a cross section of the device precursor. FIG. 6F is a cross section of a frame member 44 shown in FIG. 6E taken along the line labeled F in FIG. 6E. Suitable methods of forming each shell layer include, but are not limited to, deposition and/or growth techniques such as chemical vapor deposition (CVD), atomic layer deposition (ALD). Since atomic layer deposition (ALD) can provide a coating with a thickness at the angstrom level, atomic layer deposition (ALD) is an example of a method that is suitable for achieving shell layers having the thickness levels described above. Atomic layer deposition (ALD) typically includes sequentially reacting different gas phase precursors with the surface of the frame members 44 in a self-limiting chemical process. In some instances, the process is repeated in order to provide the shell layer with the desired thickness. Different shell layers can be formed using different deposition techniques or using the same deposition technique. In instances where the frame members 44 are constructed of the materials that are desired for the cores of the struts, the frame on the device precursor of FIG. 6E and FIG. 6F can serve as the scaffold.

Figure 6G:
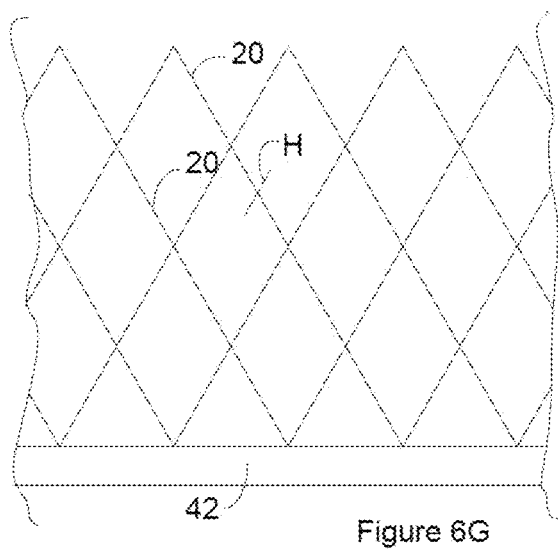
Figure 6H:
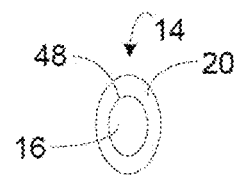

When it is desirable for the core to include a material that is different from the material of the fame members, the frame members 44 can be removed so as to form the device precursor of FIG. 6G and FIG. 6H. FIG. 6G is a cross section of the device precursor. FIG. 6H is a cross section of a frame member 44 shown in FIG. 6G taken along the line labeled H in FIG. 6G. Suitable methods for removing the frame members 44 include, but are not limited to, etching. For instance, when the frame precursor 40 is IP-DIP 780 photoresist, the frame members 44 can be removed by oxygen plasma etching. When the shell 20 protects the underlying frame members 44 from etching, it may be necessary to expose the frame members 44 at one or more locations prior to etching. Suitable methods of exposing the frame members 44 to prepare for etching include, but are not limited to, etching methods including Focused Ion Beam (FIB) etching.

Removal of the frame members 44 leaves a hollow shell 20 that can optionally serve as the struts 14 in the final scaffold. Accordingly, removing the frame members 44 can form or leave the lumen 48 in the shell 20. The material that is currently in the lumen or that will occupy the lumen at a later time can serve as the core of the struts. In some instances, the interiors of the lumens are exposed to the atmosphere in which the scaffold is positioned. As the result, the cores 16 of the struts 14 can be filled with a gas or a liquid depending on the content of the atmosphere in which the scaffold is positioned. As an example, when the device is located in air, air generally will occupy the core 16 of the struts 14 and when the device is located in a liquid, the liquid can occupy the core 16 of the struts 14. Accordingly, the material in the core 16 of the struts 14 can change as the scaffold is moved from one location to another. Alternately, the device and/or the resulting scaffold can be encapsulated in a solid material and the core 16 of the struts 14 can be filled with the solid encapsulating material.

In some instances, it may be desirable to fill the lumens 48 with a solid material so as to provide solid cores 16. Suitable methods for filling the shells 20 include, but are not limited to, electroplating. As an example, when it is desirable to fill the hollow shells 20 with a metal, the substrate 42 can be electrically conducting and in contact with the interior of the shell 20, the substrate 42 can be used to electroplate at least the interior of the shell 20. As another example, deposition and/or growth techniques can be used to form another layer of material on the interior and/or exterior of the shell 20. Suitable deposition or growth techniques include, but are not limited to, chemical vapor deposition (CVD), atomic layer deposition (ALD).

One or more shell layers can be treated as a sacrificial shell layer (not illustrated) during or after the removal of the frame members 44. The sacrificial shell layer can be the first shell layer formed on the frame members 44 or can be formed after other shell layers are formed on the frame members 44. The sacrificial shell layer can be removed during or after the removal of the frame members 44. Accordingly, additional shell layers can be formed on a sacrificial shall layer before or after the removal of the frame members 44. A sacrificial shell layer can acts as a buffer between materials and/or can be used to increase the compatibility between different materials during the fabrication process. In one example, a sacrificial shell layer is formed directly on the frame members 44 and then the frame members 44 are removed. A second shell layer is formed on the sacrificial shell layer and the sacrificial shell layer is then removed leaving the second shell layer to serve as the struts. A suitable method for removing the sacrificial shell layer includes, but is not limited to, etching. The sequence of forming a shell layer or a second sacrificial shell layer over a first sacrificial shell layer followed by removal of the first sacrificial shell layer can be repeated.

Figure 7A:
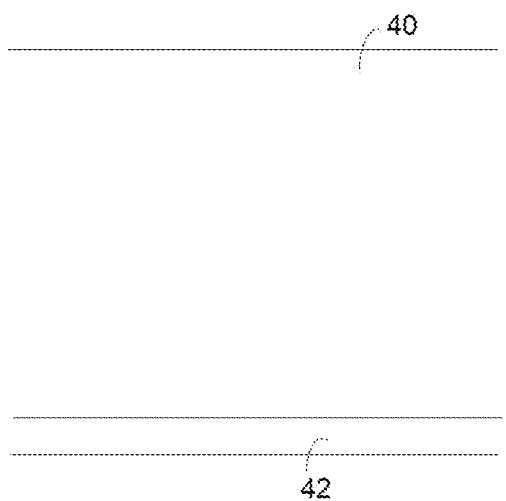

FIG. 7A through FIG. 7J illustrate another embodiment of method for generating a scaffold having octahedral unit cells. A frame precursor 40 is formed on a substrate 42 so as to provide a device precursor having a cross section as shown in FIG. 7A. FIG. 7A is a cross section of the device precursor. The frame precursor 40 can be a positive photoresist. In some instances, the photoresist includes or consists of a photopolymer. Photopolymers change their chemical properties when exposed to light. In some instances, the photopolymer changes its solubility in a lithography developer in response to exposure of the photopolymer to light of a particular wavelength or range of wavelengths. For instance, a suitable photopolymer can polymerize and/or cross link in response to exposure of the photopolymer to the light. An example of a suitable photopolymer includes, but is not limited to, AZ4620 available from Microchem Corp. located in Newton, Mass. Suitable materials for the substrates 42, include, but are not limited to, metals such as aluminum and electrically insulating materials.

Figure 7B:
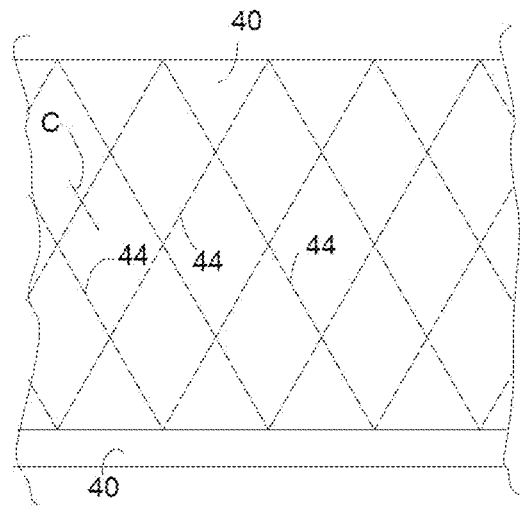
Figure 7C:
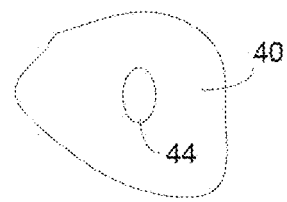

Frame members 44 are formed in the frame precursor 40 of FIG. 7A so as to form the device precursor of FIG. 7B and FIG. 7C. FIG. 7B is a cross section of the device precursor. The frame precursor 40 includes multiple frame members 44. FIG. 7C is a cross section of a frame member 44 shown in FIG. 7B taken along the line labeled C in FIG. 7B. As will become evident below, the frame members 44 will be replaced by one or more materials that serve as the cores for the struts in the final scaffold. Accordingly, the arrangement of the frame members 44 approximates the desired arrangement for the cores of the struts in the resulting scaffold. As a result, in some instances, the frame members 44 have the same dimensions as are set forth for the cores of the struts.

A suitable method for forming the frame members 44 in the frame precursor 40 includes, but is not limited to, multiphoton photolithography as described above. As noted above, multiphoton photolithography can be performed using a focused light source and without a photomask. By controlling the location of the focal point or focal volume of the light source within the frame precursor 40, the location of the chemical change within the frame precursor 40 can be controlled. For instance, the device precursor can be moved relative to the focal point of the light source such that the focal point or focal volume of the light source effectively scans the desired locations of the frame members 44 within the frame precursor 40. In some instances, the locations where the scanning has caused the desired chemical change in the frame precursor 40 serve as the frame members 44.

Figure 7D:
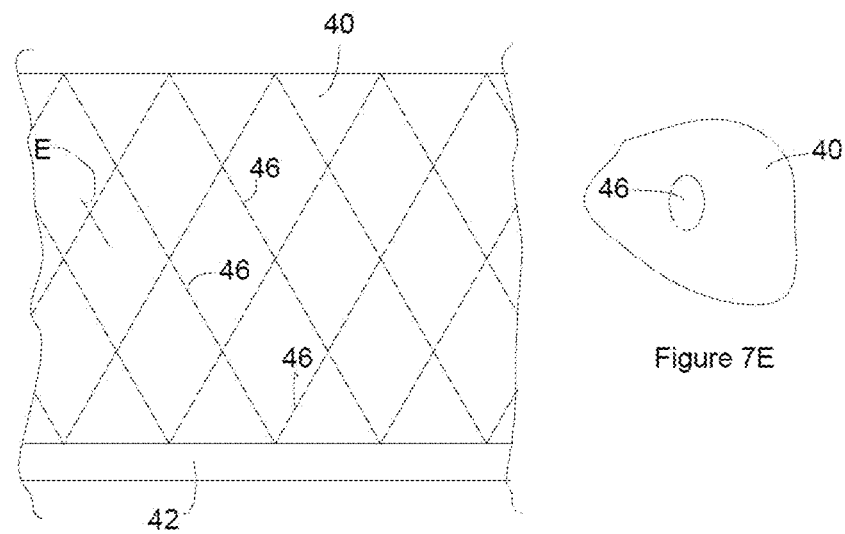
Figure 7E:
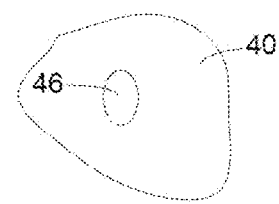

The frame members 44 can be removed from the device precursor of FIG. 7B and FIG. 7C so as to form the device precursor of FIG. 7D and FIG. 7E. FIG. 7D is a cross section of the device precursor. FIG. 7E is a cross section of a frame void 46 shown in FIG. 7D taken along the line labeled E in FIG. 7D. The frame members 44 can be removed by developing and/or etching. For instance, when the frame precursor 40 is AZ4620, the frame members 44 can be removed by developing and oxygen plasma etching. The removal of the frame members 44 leaves frame voids 46 in the frame precursor 40. As will become evident below, the remaining frame precursor 40 acts as a template for the scaffold.

The frame voids 46 in the device precursor of FIG. 7D and FIG. 7E are fully or partially filled with a material so as to provide the device precursor of FIG. 7F and FIG. 7G. FIG. 7F is a cross section of the device precursor. FIG. 7G is a cross section of a frame void 46 shown in FIG. 7F taken along the line labeled G in FIG. 7F. The material in the fame voids replaces the frame members 44 and can serve as cores 16 of the struts 14 in the resulting scaffold. Suitable methods for filling the frame voids 46 include, but are not limited to, electroplating. As an example, when it is desirable to fill the frame voids 46 with a metal, the substrate 42 can be electrically conducting and the substrate 42 can be used to electroplate the interiors of the frame voids 46.

The remaining frame precursor 40 can be removed from the device precursor of FIG. 7F and FIG. 7G so as to form the device precursor of FIG. 7H. FIG. 7H is a cross section of the device precursor. When the remaining frame precursor 40 acts as a photoresist, the frame precursor 40 can be removed with a developer. In instances where a shell 20 is not desired on the core 16 of the struts 14, the frame on the device precursor of FIG. 7H can serve as the scaffold.

Figure 7I:
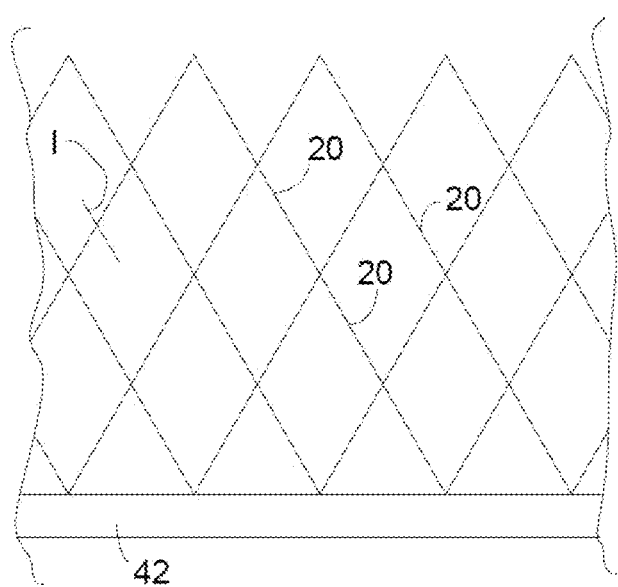
Figure 7J:
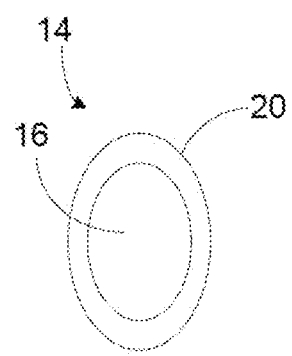

When it is desirable for the struts to include a shell 20, the shell 20 can be formed on cores 16 in the device precursor of FIG. 7H so as to form the device precursor of FIG. 7I and FIG. 7J. FIG. 7I is a cross section of the device precursor. FIG. 7J is a cross section of a frame member 44 shown in FIG. 7I taken along the line labeled J in FIG. 7I. Suitable methods of forming each shell layer include, but are not limited to, deposition and/or growth techniques such as chemical vapor deposition (CVD) and its variants such as atomic layer deposition (ALD). In particular, atomic layer deposition (ALD) is suitable for achieving shell layers having the thickness levels described above. Atomic layer deposition (ALD) typically includes sequentially reacting different gas phase precursors with the surface of the frame members 44 in a self-limiting chemical process. In some instances, the process is repeated in order to provide the shell layer with the desired thickness. Different shell layers can be formed using different deposition techniques or using the same deposition technique. In instances where the frame members 44 are constructed of the material that is desired for the cores 16 of the struts 14, the frame on the device precursor of 7H and FIG. 7I can serve as the scaffold.

In the methods of FIG. 6A through FIG. 7I, the substrate 42 can optionally be removed after fabrication of the scaffold. Suitable methods for removing the substrate 42 include, but are not limited to, etching and mechanical methods such as polishing. In some instances, the upper surface of the scaffold is bonded or attached to a second substrate (not shown) before removal of the substrate 42. Accordingly, the substrate 42 can be used for fabrication of the scaffold without the substrate 42 being present in the final product. Additionally or alternately, the above scaffolds can optionally be encapsulated in an encapsulating material that fills in the voids in the scaffold and/or spans the gap between the struts in the scaffold. Suitable encapsulating materials include, but are not limited to, polymers, epoxies.

The above methods of scaffold fabrication can employ multiphoton absorption to form the frame members 44 in the frame precursor 40.

The above methods of scaffold fabrication allow features to be formed centrally within the frame precursor 40. This ability allows the scaffolds to be formed with more complex features. For instance, all or a portion of the struts in a scaffold can be curved. These methods also permit a high level of resolution even at the nanometer and micron level scaffold dimensions disclosed above. As a result, the scaffolds can include more sophisticated construction features. For instance, the struts need not all have the same dimensions. Accordingly, in some instances, a first portion of the struts have different cross sectional dimensions than a second portion of the struts. For instance, the first portion of the struts can have a thicker shell 20 and/or core 16 than a second portion of the struts. Alternately or additionally, the first portion of the struts can have larger cross sectional dimensions than a second portion of the struts. Accordingly, struts that will experience higher forces during use of the scaffold can be designed to tolerate higher loads than other struts.

Figure 8A:
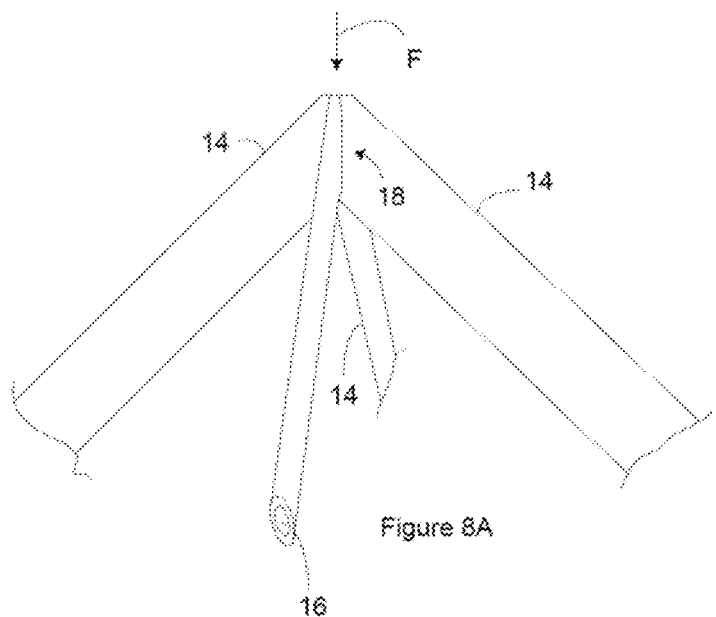
FIG. 8A through FIG. 8C illustrate four struts intersecting at a node where the struts are offset from one another.
Figure 8B:
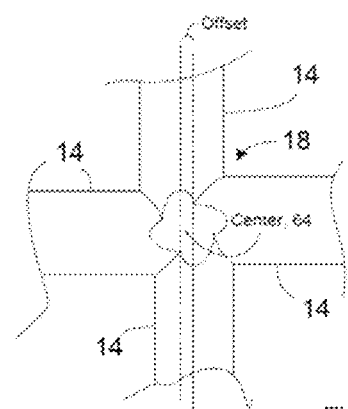
Figure 8C:
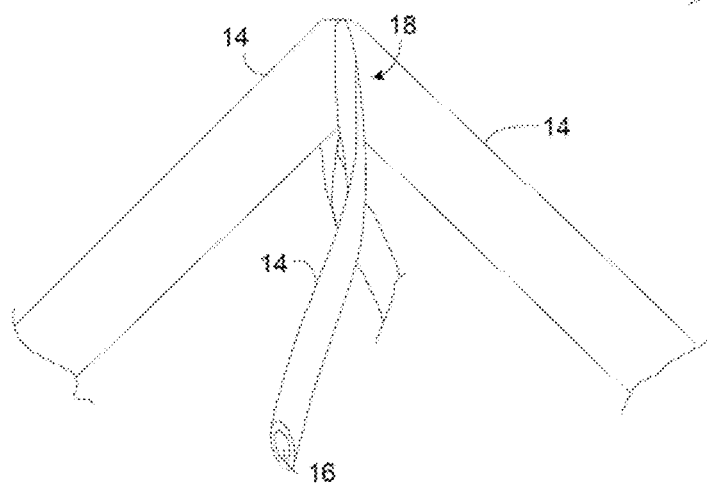

The level of detail that can be achieved with the above methods also permits more complex node 18 constructions. For instance, two or more of the struts that intersect at a node 18 can be offset relative to one another at the node 18. FIG. 8A through FIG. 8C illustrate four struts 14 intersecting at a node 18 that is suitable for use in scaffolds having unit cells such as octets or octahedrons. FIG. 8A is a perspective view of the node 18. FIG. 8B is a topview of the node 18. The struts 14 have elliptical or substantially elliptical cross section. The struts 14 have a longitudinal axis that extend longitudinally through the center of the strut 14. This offset is best viewed from FIG. 8B. The longitudinal axis for two of the struts 14 is illustrated in FIG. 8B. The struts 14 are offset such that the longitudinal axes of the struts 14 do not intersect one another. Accordingly, a node center 64 can be located between the longitudinal axes of offset struts 14 without any of the offset strut 14 longitudinal axes intersecting the center. The offset distance is labeled "Offset" in FIG. 8B. In some instances, the distance of the offset is more than 1 nm, 5 nm or 10 nm and/or less than 50 microns or less than 10 microns.

In FIG. 8A and FIG. 8B, each of the longitudinal axes passes on the same side of the node center 64. For instance, each of the longitudinal axes is to the right of the node center 64. As a result, when a force is applied in the direction of the arrow labeled F in FIG. 8A, the struts 14 twist as shown in FIG. 8C rather that bending outwards. This twisting may allow the struts 14 and/or node 18 to survive forces that could not be tolerated if the struts 14 were aligned relative to one another.

FIG. 8A through FIG. 8C illustrate all of the struts 14 as being offset relative to one another; however, a node 18 can include struts 14 that are offset and struts 14 that are not offset. For instance, in FIG. 8B, the struts 14 extending upward and downwards can remain offset while the struts 14 extending to the left and right can be aligned with one another in that their longitudinal axes intersect within the node 18. Further, although the node 18 of FIG. 8A through FIG. 8C illustrates four struts 14 intersecting at a node 18, the node 18 can include odd numbers of struts 14 that are offset relative to one another. Accordingly, all or a portion of the nodes 18 in a scaffold can include two or more struts 14 that are offset relative to one another. When a node 18 includes two or more struts 14 that are offset relative to one another, the offset struts 14 can all be offset in the same direction relative to the node center 64 but need not be offset in the same direction relative to the node center 64. Accordingly, all or a portion of the nodes 18 in a scaffold can include two or more struts 14 that are offset relative to one another where at least a portion of the struts are offset in the same direction.

The above scaffolds can be applied in technologies such as biomedical devices, nanophotonics, and thermoelectrics. Additionally, these scaffolds can be inserted into band gap driven technologies such as photovoltaics and acoustic materials because the dimensions of the scaffold features can be tuned down at the nanometer level. A particular application of the above scaffolds is electrodes. The electrodes can be used in any application such as electrochemistry, electrophoresis, capacitors, photovoltaics, micro- and nano-eletrochemical systems (MEMS and NEMS), optoelectronic devices, catalysis, and lab-on-a-chip.

The scaffold itself can serve as the electrode. For instance, the electrode can include or consist of a scaffold where the cores and/or the shells each includes or consists of an electrically conducting materials such as a metal. Alternately, the scaffold combined with the substrate can serve as an electrode. For instance, the electrode can include or consist of both the scaffold and substrate where the cores and/or the shells each includes or consists of an electrically conducting materials such as a metal. Accordingly, the electrode can include or consist of the scaffold or both the scaffold and the substrate. A liquid or solid sample in contact with the scaffold can penetrate the regularly spaced openings between the struts. As a result, a high degree of contact between is the sample and the electrode is achieved and is evenly distributed across the electrode. Such electrode constructions are suitable for applications such as electrochemistry, electrophoresis.

In another application, the struts include one or more active materials into which a molecule (element, compound, ion or anion) intercalates or deintercalates during operation of the electrode. For instance, the struts can include or consist of a shell 20 that includes or consists of one or more intercalation materials. One of the problems with electrodes used in applications where molecules intercalate into the electrode is swelling of the electrode. This swelling can degrade the performance of the electrode and/or damage the electrode. However, when the electrode includes one of the above scaffolds, the struts can swell into the space between the struts and/or into the core. Accordingly, the scaffold can provide an electrode with an enhanced tolerance to the intercalation of the molecule into the electrode during operation of the electrode.

Figure 9:
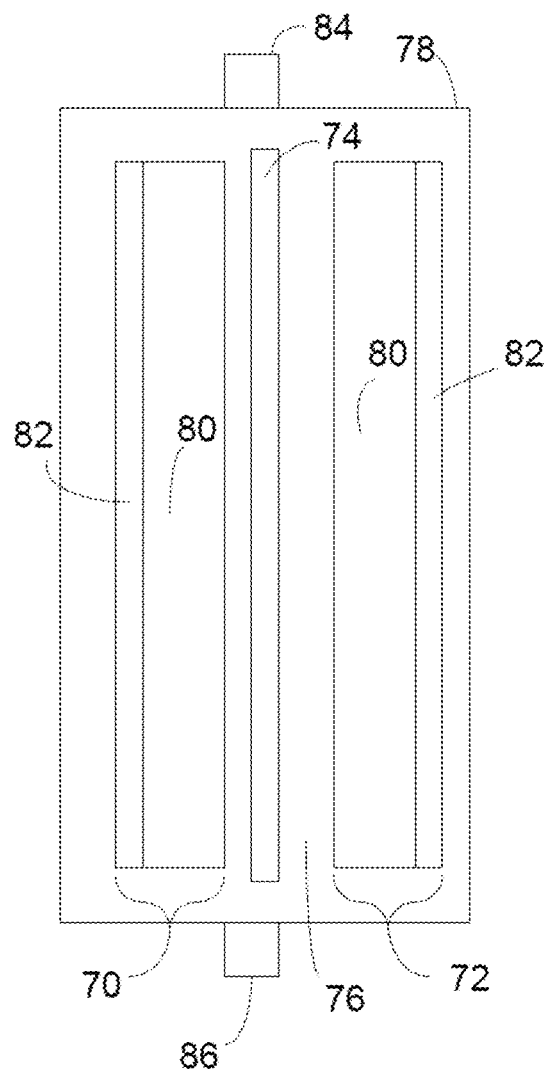
FIG. 9 is a schematic of a typical battery construction.

Batteries are an example of an application where a molecule intercalates and/or deintercalates from one or more electrodes. FIG. 9 presents a schematic of a typical battery construction. The battery includes a positive electrode 70, a negative electrode 72, a separator 74, and an electrolyte 76 in a case 78. The separator 74 is positioned between the positive electrode 70 and the negative electrode 72. The electrolyte 76 activates the positive electrode 70 and the negative electrode 72. The positive electrode 70 and the negative electrode 72 each includes an active medium 80 on a current collector 82. The active media include or consist of the active materials that take part in the chemical reactions during the charging and/or discharge of the battery. Although not illustrated, the current collector 82 from the positive electrode 70 is in electrical communication with a positive terminal 84 and the current collector 82 from the negative electrode 72 is in electrical communication with a negative terminal 86.

The positive electrode 70 and/or the negative electrode 72 can include one or more of the above scaffolds. For instance, the substrate 42 can be electrically conducting and can accordingly serve as the current collector 82. The active medium 80 can include the scaffold. For instance, the shell 20 of the struts can include or consist of the active material. In some instances, the cores of the struts are hollow. When the cores of the struts are hollow, the cores of the struts can be sealed off from the atmosphere in which the scaffold is positioned or can be exposed to the atmosphere in which the scaffold is positioned. For instance, openings made as a result of exposing the frame members before removing the frame members can cause the cores of the struts to be exposed to the atmosphere in which the scaffold is positioned. Additionally or alternately, the shell can be sufficiently porous to permit the atmosphere in which the scaffold is positioned to penetrate through to the cores of the struts. Alternately, the cores can be sealed off from the atmosphere in which the scaffold is positioned as a result of process steps such as forming one or more shell layers and/or dummy shell layers on the struts subsequent to the exposure the frame members before removing the frame members. When the cores of the struts are hollow, the electrolyte 76 is a liquid, and the cores of the struts are exposed to the atmosphere in which the scaffold is positioned, the liquid electrolyte 76 can fill the cores of the struts and can serve as the cores of the struts. As a result, the electrolyte 76 can contact the inside and the outside of the struts and enhance the wetting of the active medium 80 by the electrolyte 76. Alternately, the cores of the struts can be filled with an electrically conducting medium such as a metal. The cores of the struts can be in contact with the substrate or current collector 82 as is evident from the above discussion. As a result, placement of the electrically conducting medium in the cores of the struts can provide an electrical pathway between the active medium 80 in shell 20 and the current collector 82. The enhanced electrical communication between the active medium 80 and the current collector 82 can accordingly reduce the internal resistance of the battery. In some instances, the electrically conducting medium in the core of the struts is the same material as the substrate 42. Suitable materials for use as a substrate 42 that will serve as a current collector 82 include, but are not limited to, metals such as copper, aluminum, and titanium.

Suitable materials for use as the shell 20 that will include or consist of active material include, but are not limited to, silica.

In one example, the battery is a secondary (or rechargeable) lithium ion battery and the negative electrode 72 includes a scaffold where the struts have shells 20 that include or consist of silicon. In some instances, the silicon is amorphous silicon due to the smaller volume changes during intercalation as compared with crystalline silicon. The substrate is an electrically conducting material that can act as a current collector. The cores can be hollow or filled with a solid material. When the core is filled with a solid material, the solid material can be an electrically conducting material that is in electrical communication with the substrate. Additionally, the negative electrode 72 includes or consists of lithium cobalt oxide and/or graphite as an active material. The electrolyte 76 can be any variety of electrolytes 76 such as traditional organic electrolytes 76 that include one or more salts dissolved in an organic solvent. Additionally, the separator 74 can include or consist of traditional separator materials.

Although the battery is disclosed in the context of a secondary battery, the battery can be a primary (non-rechargeable) battery. As a result, terms such as negative electrode also include anodes and positive electrode includes cathodes. Further, the battery can have a variety of different electrode configurations. For instance, the battery can include two or more electrodes wound in a jellyroll configuration or can include two or more electrodes in a stack configuration. As a result, a battery can include two or more electrodes that each includes one of the disclosed scaffolds. Further, one or more of the electrodes can be constructed without the current collector as is known in the battery arts.

EXAMPLES

Example 1

A scaffold was generated with a series of tessellated regular octahedral units connected at their vertices. Each octahedron was made up of 7 µm-long hollow struts with elliptical cross sections and wall thickness of 75 nm. The resulting scaffold was 100 µm in each direction. TiN serves as the shell.

The method of FIG. 6A through FIG. 6H was used to generate the scaffold. IP-Dip 780 photoresist served as the frame precursor. Direct laser writing (DLW) used two-photon lithography to form the frame members within the frame precursor. The direct laser writing (DLW) was performed at a speed of 50 µm/sec and laser power of 10 mW using the Photonic Professional DLW system (Nanoscribe GmbH, Germany). The resulting frame members were separated from the remaining frame precursor using a developer. The frame members were then conformally coated one monolayer at a time with TiN using an Oxford OpAL Atomic Layer Deposition (ALD) system (Oxfordshire, UK) at 140° C. The deposition was performed by sequentially cycling through the following steps: i) flowing the reactant dose of Titanium Tetrachloride (TiCl4) precursor for 30 ms, ii) purging the system for 5 sec, iii) plasma treatment with an $N_2/H_2$ gas mixture (25 sccm/25 sccm) for 10 sec, and iv) purging the system for an additional 5 sec. This process was repeated until a 75 nm thick layer was deposited. The TiN coating was then removed along an outer edge of the structure using focused ion beam (FIB) in the FEI Nova 200 Nanolab to expose a portion of the frame members. The frame members were subsequently removed by etching in a barrel oxygen plasma etcher for 3 hours under 100 W and 300 sccm oxygen flow. The remaining TiN served as the struts of the scaffold.

In-situ compression experiments were performed on the octahedral unit cell by applying an axial load along the vertical axes of the unit cells. The experimentally obtained force vs. displacement data was input into a finite element method (FEM) framework to estimate the local stresses within the structure under the applied load. Results revealed the attainment of very high von Mises stresses of 2.50 GPa, a value close to the theoretical strength of TiN without failure.

Example 2

An electrode is constructed using an aluminum substrate. An acrylic frame precursor was drop cast onto the substrate. Direct laser writing (DLW) used two-photon lithography to form the frame members within the frame precursor. The frame members had an elliptical cross section with a semi-major axis down to ~300 nm and a semi-minor axis down to 75 nm. The undeveloped frame precursor was removed using propylene glycol monomethyl ether acetate (PGMEA). Next a sacrificial shell layer of silica was deposited on the frame members using RF plasma sputtering. Focus ion beam milling was used to remove a portion of the silica so as to expose a portion of the frame members. The frame members were subsequently removed by etching in a barrel oxygen plasma etcher for 3 hours. A sub-100 nm thick layer of amorphous silicon was sputter-coated conformally on the sacrificial shell layer. The sacrificial shell layer was removed using buffered hydrofluoric acid. The remaining layer of amorphous silicon served as the hollow struts of the scaffold. The silicon can serve as the active material of a battery electrode and the aluminum substrate can serve as the current collector.

Example 3

The method of FIG. 7A through FIG. 7J was used to generate a scaffold. A 170 µm thick glass slide was obtained. A 60 nm thick layer of indium titanium oxide (ITO) was sputtered onto the glass slide so as to provide an electrically conducting substrate. A positive photoresist of AZ4620 (Microchem) was used as a frame precursor. The frame precursor was spun onto the substrate with a thickness of 20-30 µm and soft-baked for 3 minutes at 110° C. Direct laser writing (DLW) used two-photon lithography to form the frame members within the frame precursor. The direct laser writing (DLW) was performed with a 780 nm wavelength laser. The frame members with cross sectional dimension of 900 nm to 4 microns could be generated by changing the laser power from 0.5 mW to 1.2 mW. The frame members were removed from the frame precursor so as to leave frame voids in the frame precursor. The frame members were removed by developing the frame precursor in 1:4 diluted AZ400 (Microchem) for eight minutes followed by exposure to oxygen plasma at 100 W and 300 sccm for two minutes. The resulting frame voids were opened all the way down to the substrate. Potentiostatic electrodeposition was then used in a miniature three-electrode electrochemical cell in order to place the material for the cores of the struts in the voids. In one instance, the frame voids were filled with nickel. In these instances, the electroplating was performed at 2V in an aqueous Ni bath containing 240 g/l $NiSO_4.6H_2O$, 45 g/l $NiCl_2.6H_2O$, and 40 g/l $H_3BO_3$. In another instance, the frame voids were filled with copper. In these instances, the electroplating was performed in a bath containing 125 g/l $CuSO_4 \cdot 5H_2O$, 50 g/l $H_2SO_4$. The remaining frame precursor was removed by soaking in N-methylpyrrolidone. The copper or nickel that remained served as the cores for the struts in the scaffold. In some instances, a material that serves as an active medium for a battery electrode is coated onto the cores.

Example 4

Multiple different scaffolds were generated using the method of FIG. 6A through FIG. 6H. A thin layer of Cu was deposited onto the frame members using RF magnetron sputtering to improve electrical conductivity across the nano-lattice. A conformal layer of amorphous Si with thickness of hundreds of nanometers is sputtered over the Cu as the electroactive material. The frame members were then removed. The porosity of the structure was selected such that expanding Si will fill a substantial fraction of free space in the structure upon lithiation, which results in high energy density. One of the scaffolds was built with octet unit cells and another scaffold was built with auxectic structures.

An electrochemical cell was built inside of a scanning electron microscope (SEM) using a lithium metal electrode, $Li_2O$ solid electrolyte and the above scaffold. The Li metal electrode and the $Li_2O$ electrolyte was mounted on a telescoping mechanical arm that extends into the SEM vacuum chamber. The above scaffolds were used as a Si electrode that was placed on the sample stage, and oriented so that changes in volume can be observed using the scanning electron beam. The electrolyte was contacted to the Si electrode and a constant voltage bias is applied between the two electrodes during electrochemical cycling. Lithiation is performed at a −4V bias, and delithiation is performed at a +4V bias.

The lithiation and delithiation of the octet structure showed that lithiation causes each strut to change volume, and the overall structure to bow out slightly at locations of high lithiation. The auxectic structure also showed volume change in each strut, but greater global volume change than the octet structure because expanding struts exert force on each other and push adjoining unit cells away from each other. Accordingly, the Si electrode is suitable for use in secondary batteries.

Example 5

Multiple different scaffolds were generated using the method of FIG. 6A through FIG. 6H. The shell was a thin film of alumina deposited onto the frame members using atomic layer deposition. After the deposition of alumina, the original polymer scaffold was exposed to air via focused ion beam (FIB) milling and etched away in $O_2$ plasma. The resulting scaffold was a freestanding ceramic nanoscaffold comprised of periodic hollow elliptical struts. The different scaffolds were generated so as to have a shell thickness varying from 5 to 60 nm, a major axis of 0.43 to 1.32 micron, and octet unit cells with a width of 5-15 micron. The scaffolds were fabricated with relative densities spanning from 0.21% to 8.6%. Taking the density of solid ALD alumina to be $\rho_s$=2900 mg/cm$^3$ gives structural densities of $\rho$=6.1 to 249 mg/cm$^3$, which places the lightest scaffolds in the ultralight regime (mg/cm$^3$).

Monotonic and cyclical compression tests were performed in a G200 Nanoidenter (Agilent Technologies). In a first set of experiments, scaffolds were compressed uniaxially to ~50% strain at a rate of $10^{-3}$ s$^{-1}$ to determine their yield stress and overall deformation characteristics. In a second set of experiments, structures were cyclically loaded and unloaded 3 times to ~70% of their failure load, and the unloading slope of each of the cycles was measured and averaged to determine the Young's modulus. The unloading modulus was taken from cyclic loading tests in order to mitigate the effect of loading imperfections in the uniaxial tests. Additional samples were compressed in an in-situ nanomechanical instrument (Nanomechanics Inc.) to reveal the failure modes (yielding or buckling) that occurred during deformation.

Scaffolds having a structural ratio of the shell wall thickness to major axis length less than or equal to 0.02 did not exhibit catastrophic failure or discrete strain bursts. Instead, the structures underwent a ductile-like, controlled deformation, and the stresses fluctuated around the peak stress after yielding. As the structural ratio of the structures is decreased, the scaffolds exhibit a smoother and continuous deformation. Surprisingly, these ceramic scaffolds recovered by up to 98% after being compressed to 50% strain, and by ~80% after compression to 85% strain.

Although the above methods of scaffold fabrication are disclosed in the context of an octahedral scaffold, these methods are easily adapted to other unit cell types by using direct laser writing to define the desired unit cell configuration.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of fabricating a scaffold, comprising:
employing multiphoton absorption to define frame members in a frame precursor; and
using the frame members to form struts that intersect at nodes so as to define repeating unit cells of a scaffold; and
forming one or more shell layers on the frame members.

2. The method of claim 1, wherein using the frame members to form the struts include replacing the frame members with cores of the struts.

3. The method of claim 2, wherein the cores of the struts are a liquid or a gas.

4. The method of claim 3; wherein replacing frame members with the cores includes removing the frame members from within the one or more shell layers.

5. The method of claim 4, wherein the one or more shell layers includes a ceramic.

6. The method of claim 3, wherein replacing frame members with the cores includes removing the frame members from within the frame precursor so as to form voids in the frame precursor and placing in the voids a solid material that serves as the cores.

7. The method of claim 3, further comprising:
separating a portion of the frame precursor that is not converted to the frame members from the cores.

8. The method of claim 1, wherein the frame precursor is sensitive to multiphoton polymerization.

9. A method of fabricating a micro- or nano-scale scaffold, comprising:
providing a framework precursor, wherein the framework precursor is subject to multiphoton polymerization;
contacting the framework precursor with multiphotons in a desired configuration to generate a plurality of polymerized struts interacting at nodes thereby generating the micro- or nano-scale scaffold; and coating the polymerized struts with a material.

10. The method of claim 9, wherein the scaffold is less than 50 microns across in a particular direction.

11. The method of claim 9, wherein the multiphotons are provided by at least two lasers having a focal point at a desired location to polymerize a framework precursor.

* * * * *